(12) United States Patent
Palubiak

(10) Patent No.: US 11,108,980 B2
(45) Date of Patent: Aug. 31, 2021

(54) SEMICONDUCTOR DEVICES WITH SINGLE-PHOTON AVALANCHE DIODE PIXELS

(71) Applicant: SEMICONDUCTOR COMPONENTS INDUSTRIES, LLC, Phoenix, AZ (US)

(72) Inventor: Dariusz Piotr Palubiak, Cork (IE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 179 days.

(21) Appl. No.: 16/389,070

(22) Filed: Apr. 19, 2019

(65) Prior Publication Data

US 2020/0252564 A1 Aug. 6, 2020

Related U.S. Application Data

(60) Provisional application No. 62/800,840, filed on Feb. 4, 2019.

(51) Int. Cl.
*H04N 5/378* (2011.01)
*H01L 31/107* (2006.01)
(Continued)

(52) U.S. Cl.
CPC ....... *H04N 5/378* (2013.01); *H01L 27/14612* (2013.01); *H01L 27/14643* (2013.01); *H01L 31/02027* (2013.01); *H01L 31/107* (2013.01)

(58) Field of Classification Search
CPC .... H04N 5/378; H04N 5/37455; H04N 5/369; H01L 31/107; H01L 27/14643; H01L 27/14612; H01L 31/02027
See application file for complete search history.

(56) References Cited

U.S. PATENT DOCUMENTS

2001/0020673 A1 9/2001 Zappa et al.
2011/0266420 A1 11/2011 Eldesouki et al.
(Continued)

FOREIGN PATENT DOCUMENTS

GB 2509545 7/2014

OTHER PUBLICATIONS

Mroszczyk et al., Tunable CMOS Delay Gate With Improved Matching Properties, IEEE Transactions on Circuits and Systems—I: Regular Papers, vol. 61, No. 9, Sep. 2014.
(Continued)

*Primary Examiner* — Thanh Luu
*Assistant Examiner* — Monica T Taba
(74) *Attorney, Agent, or Firm* — Treyz Law Group, P.C.; Tianyi He

(57) ABSTRACT

A semiconductor device may include an array of single-photon avalanche diode pixels. The single-photon avalanche diode (SPAD) pixels may include a SPAD coupled to a supply voltage terminal via first and second reset paths. The first reset path may be a fast reset path that provides the SPAD with a short recovery time. The second reset path may be a slower reset path that provides the SPAD with a longer recovery time, but is used to ensure the SPAD is quenched even when the quench resistance associated with the first reset path is low. Logic circuitry may selectively activate the first or the second resets to quench and reset the SPAD. A SPAD pixel may also include one or more switches that keep nodes in the SPAD pixel at a constant voltage when the SPAD pixel is inactive.

15 Claims, 8 Drawing Sheets

(51) Int. Cl.
   *H01L 27/146* (2006.01)
   *H01L 31/02* (2006.01)

(56) References Cited

U.S. PATENT DOCUMENTS

2015/0285625 A1* 10/2015 Deane .................. G01S 7/4863
                                                                  348/140
2017/0131143 A1*  5/2017 Andreou ........... H01L 31/02027

OTHER PUBLICATIONS

Bronzi et al. Fast Sensing and Quenching of CMOS SPADs for Minimal Afterpulsing Effects, IEEE Photonics Technology Letters, vol. 25, No. 8, Apr. 15, 2013.

* cited by examiner

SEMICONDUCTOR DEVICES WITH SINGLE-PHOTON AVALANCHE DIODE PIXELS

This application claims the benefit of provisional patent application No. 62/800,840, filed Feb. 4, 2019, which is hereby incorporated by reference herein in its entirety.

BACKGROUND

This relates generally to imaging systems and, more particularly, to imaging systems that include single-photon avalanche diodes (SPADs).

Modern electronic devices such as cellular telephones, cameras, and computers often use image sensors. Image sensors (sometimes referred to as imagers) may be formed from a two-dimensional array of image sensing pixels. Each pixel typically includes a photosensitive element that receives incident photons (light) and converts the photons into electrical signals. The electrical signals are used to generate image frames.

To improve sensitivity to incident light, single-photon avalanche diodes (SPADs) may sometimes be used in imaging systems. SPAD pixels may be exploited in low light conditions due to their single-photon sensitivity. However, certain applications require the pixels to also have a sufficiently large dynamic range to work at high light conditions. In these conditions, SPADs may suffer from the detector paralysis phenomenon, whereby the output digital pulse width is extended if the time-gap between individual photon arrivals (i.e., inter-arrival time) is on average less than the time it takes for the SPADs to fully recover its excess voltage (i.e., recovery time) from a previous detection event. For high intensity light, the SPADs may eventually become completely saturated and is unable to detect any photons.

Active quench and reset circuitry allows for shorter recovery time, leading to higher dynamic range. These circuits may operate to modulate the SPAD quench resistance: before a photon is detected, quench resistance is set as high as possible, and once a photon is detected and avalanche current is quenched, quench resistance is minimized to reduce recovery time and thereby extending dynamic range.

However, in these schemes, if a photon arrives during the short recovery time when the quenching resistance value is reduced to a very low value to recharge the SPAD from a previous detection event, the avalanche current growth may only be limited by the space-charge resistance of the diode. Eventually the avalanche current may reach a constant value and the detection of a subsequent photon is then almost impossible.

It would therefore be desirable to be able to provide systems with improved single-photon avalanche diode pixels.

DETAILED DESCRIPTION

Figure 1:
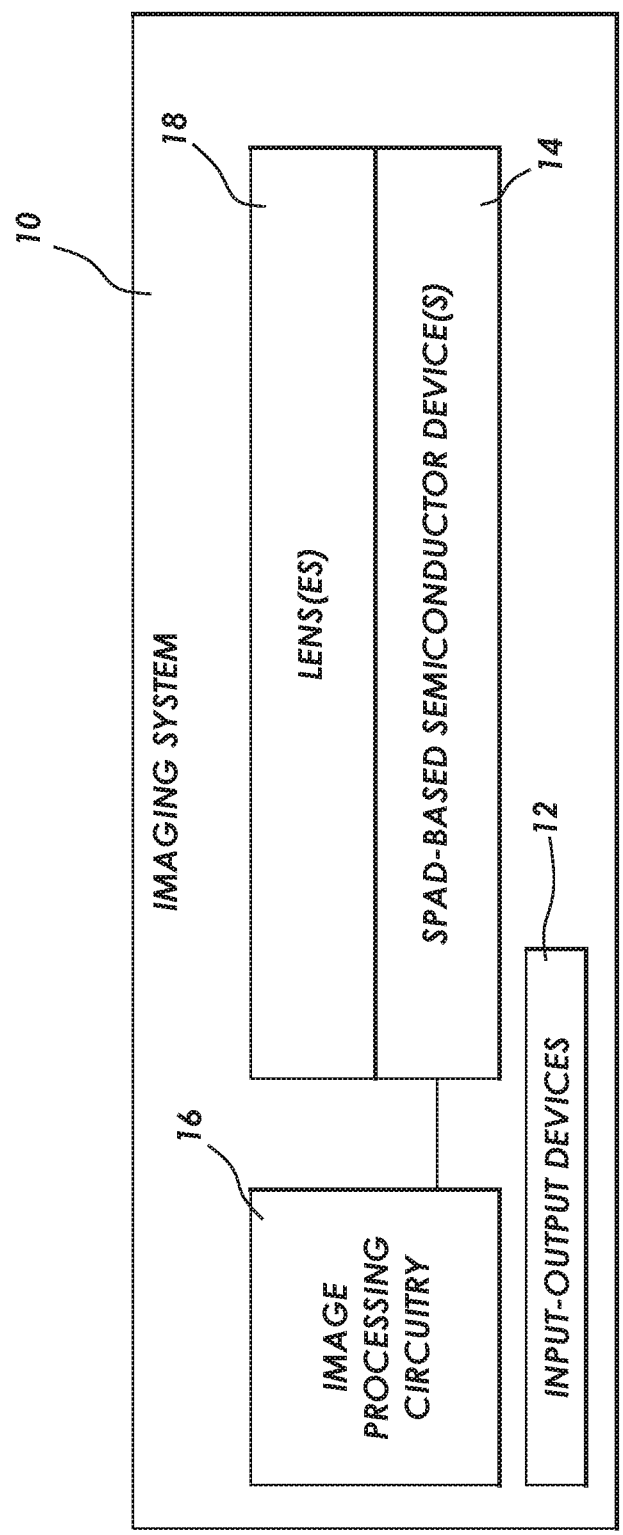
FIG. 1 is a schematic diagram of an illustrative imaging system with a SPAD-based semiconductor device in accordance with some embodiments.

Apparatus and methods according to various aspects of the embodiments herein may provide a Single Photon Avalanche Diode (SPAD) having a wide dynamic range (e.g. short pulse width) and reliable quenching even under bright conditions (e.g. shorter photon inter-arrival times). In particular, various aspects of these embodiments may be applied to long-range line-scanning applications, automotive applications, and LiDAR (light detection and ranging) applications, among other applications. Various aspects of these embodiments may improve the robustness of SPAD pixel arrays under bright light conditions. This may be particularly beneficial for automotive applications, for example, in terms of functional safety. Various aspects of these embodiments may provide wider dynamic range and lower power consumption of SPAD arrays as SPAD technologies are becoming more prevalent in automotive, consumer and medical applications.

Some imaging systems include image sensors that sense light by converting impinging photons into electrons or holes that are integrated (e.g., collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves and the analog pixel voltage is transferred to the output terminals through various pixel addressing and scanning schemes. The analog pixel voltage can also be later converted on-chip to a digital equivalent and processed in various ways in the digital domain.

On the other hand, in single-photon avalanche diode (SPAD) devices (such as the ones described in connection with FIGS. 1-8 herein), the photon detection principle is different. The SPAD is biased slightly above its breakdown point and when an incident photon generates an electron or hole, this carrier initiates an avalanche breakdown with additional carriers being generated. The avalanche multiplication may produce a current signal that can be easily detected by readout circuitry associated with the SPAD. The avalanche process needs to be stopped (i.e., quenched) by lowering the diode bias to or below its breakdown point. Each SPAD may therefore include a passive and/or active quenching circuit for quenching the SPAD. The SPAD may subsequently be biased above its breakdown point to detect additional photons.

SPAD pixels may be used in a variety of ways in imaging systems. As an example, the arriving photons may simply be counted (e.g., in low light level applications) to determine light intensity of a scene. As another example, the SPAD pixels may be used to measure photon time-of-flight (ToF) from a synchronized light source to a scene object point and back to the sensor, which can be used to obtain a 3-dimensional image of the scene. If desired, SPAD pixels may be used any other suitable manner to obtain scene information in imaging systems.

An imaging system 10 with a SPAD-based semiconductor device is shown in FIG. 1. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LiDAR applications or any other suitable applications.

Imaging system 10 may include one or more SPAD-based semiconductor devices 14 (sometimes referred to as semiconductor devices 14, devices 14, SPAD-based image sensors 14, or image sensors 14). One or more lenses 18 may optionally cover each semiconductor device 14. During operation, lenses 18 (sometimes referred to as optics 18) may focus light onto SPAD-based semiconductor device 14. SPAD-based semiconductor device 14 may include SPAD pixels that convert the light into analog signals and/or digital data. The SPAD-based semiconductor device may have any number of SPAD pixels (e.g., hundreds, thousands, millions, or more) arranged in any manner.

The SPAD-based semiconductor device 14 may optionally include additional circuitry such as bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 18) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 12 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 12 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a LiDAR scheme.

Figure 2:
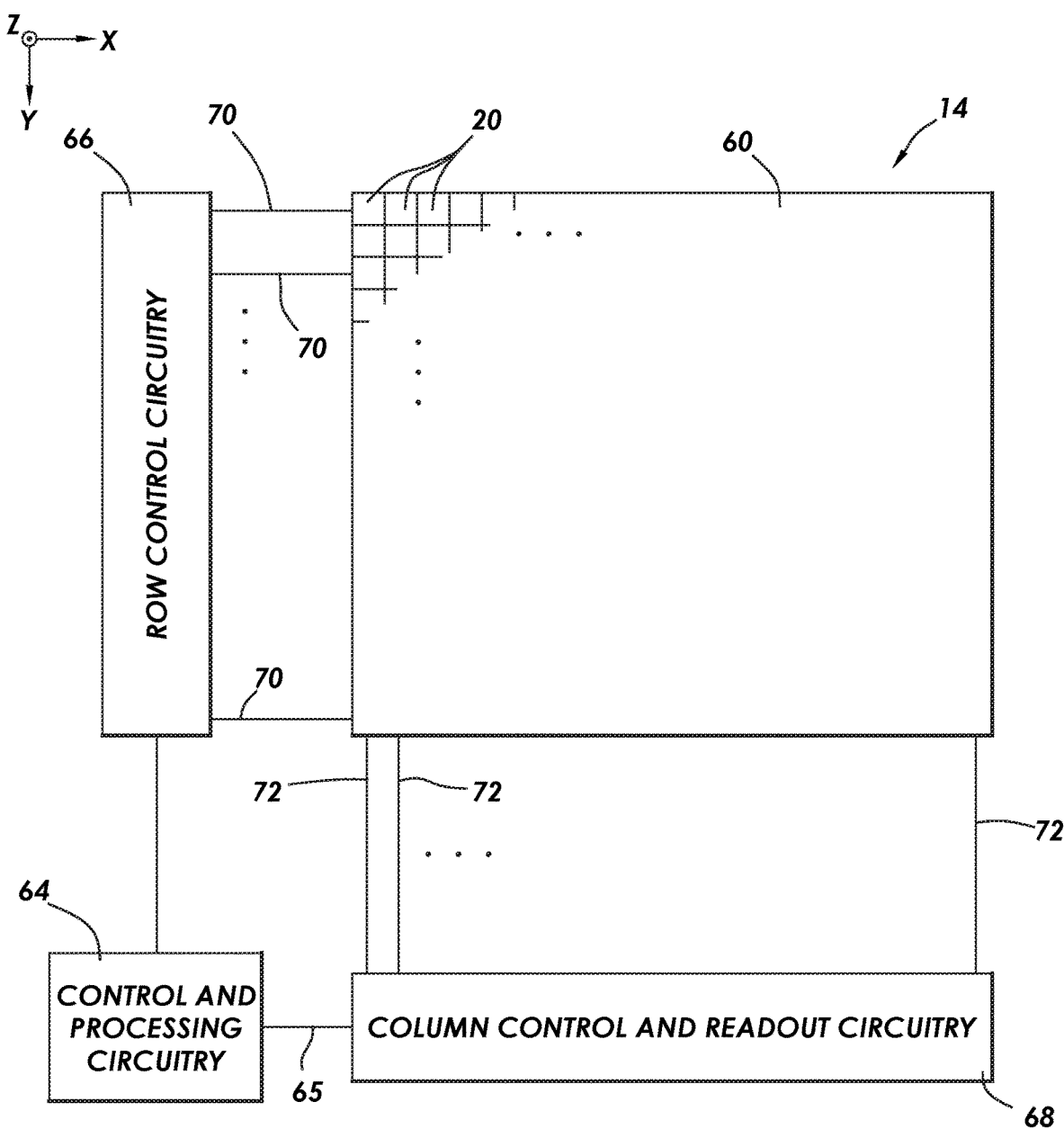
FIG. 2 is a diagram of an illustrative pixel array and associated readout circuitry for reading out image signals in a SPAD-based semiconductor device in accordance with some embodiments.

FIG. 2 shows one illustrate arrangement for semiconductor device 14 that includes an array 60 of SPAD pixels 20 (sometimes referred to herein as image pixels or pixels) arranged in rows and columns. Array 60 may include, for example, hundreds or thousands of rows and columns of SPAD pixels 20. Each SPAD pixel may be coupled to an (analog) pulse counter or other readout circuits that generates a corresponding pixel voltage based on received photons. Each SPAD pixel 20 may additionally or instead be coupled to a time-of-flight to voltage converter circuit or other suitable readout circuits. As an example, pixel voltages may be stored on pixel capacitors and may later be scanned in a row-by-row fashion. Control circuitry 64 may be coupled to row control circuitry 66 and image readout circuitry 68 (sometimes referred to as column control circuitry, readout circuitry, processing circuitry, or column decoder circuitry). Row control circuitry 66 may receive row addresses from control circuitry 64 and supply corresponding row control signals to SPAD pixels 20 over row control paths 70. One or more conductive lines such as column lines 72 may be coupled to each column of pixels 20 in array 60. Column lines 72 may be used for reading out image signals from pixels 20 and for supplying bias signals (e.g., bias currents or bias voltages) to pixels 20 (for readout operations). If desired, during pixel readout operations, a pixel row in array 60 may be selected using row control circuitry 66 and image signals generated by image pixels 20 in that pixel row can be read out along column lines 72.

Image readout circuitry 68 may receive image signals (e.g., analog or digital signals from the SPAD pixels) over column lines 72. Image readout circuitry 68 may include sample-and-hold circuitry for sampling and temporarily storing image signals read out from array 60, amplifier circuitry, analog-to-digital conversion (ADC) circuitry, bias circuitry, column memory, latch circuitry for selectively enabling or disabling the column circuitry, or other circuitry that is coupled to one or more columns of pixels in array 60 for operating pixels 20 and for reading out signals from pixels 20. ADC circuitry in readout circuitry 68 may convert analog pixel values received from array 60 into corresponding digital pixel values (sometimes referred to as digital image data or digital pixel data). Alternatively, ADC circuitry may be incorporated into each SPAD pixel 20. Image readout circuitry 68 may supply digital pixel data to control and processing circuitry 64 and/or image processing and data formatting circuitry 16 (FIG. 1) over path 65 for pixels 20 in one or more pixel columns.

The example of image sensor 14 having readout circuitry 68 to read out signals from the SPAD pixels in a row-by-row manner is merely illustrative. In other embodiments, the readout circuitry in the image sensor may simply include digital pulse counting circuits coupled to each SPAD pixel. Any other desired readout circuitry arrangement may be used.

If desired, array 60 may be part of a stacked-die arrangement in which pixels 20 of array 60 are split between two or more stacked substrates. Alternatively, or additionally, pixels 20 may be formed in a first substrate (or multiple substrates) and some or all of the corresponding control and readout circuitry may be formed in a second substrate. If desired, each of pixels 20 in the array 60 may be split between the two dies at any desired node within pixel (e.g., portions, circuit elements, transistors, charge generation/storage elements of the same pixel 20 may be split between multiple dies). As an example, readout transistors in pixels 20 may be formed on a first die while photosensitive elements in pixels 20 may be formed on a second die. As another example, charge storage structures in pixels 20 may be formed on a first die while photosensitive elements in pixels 20 may be formed on a second die. As yet another example, photosensitive sensitive elements and adjacent charge transfer transistors in pixels 20 may be formed on a first die and the rest of the circuitry in pixels 20 may be formed a second die. These examples are merely illustrative. If desired, any of these configurations or combination of configurations may be used. If desired, pixels 20, SPAD-based device 14, and/or imaging system 10 may be implemented on (split between) more than two dies.

Figure 3:
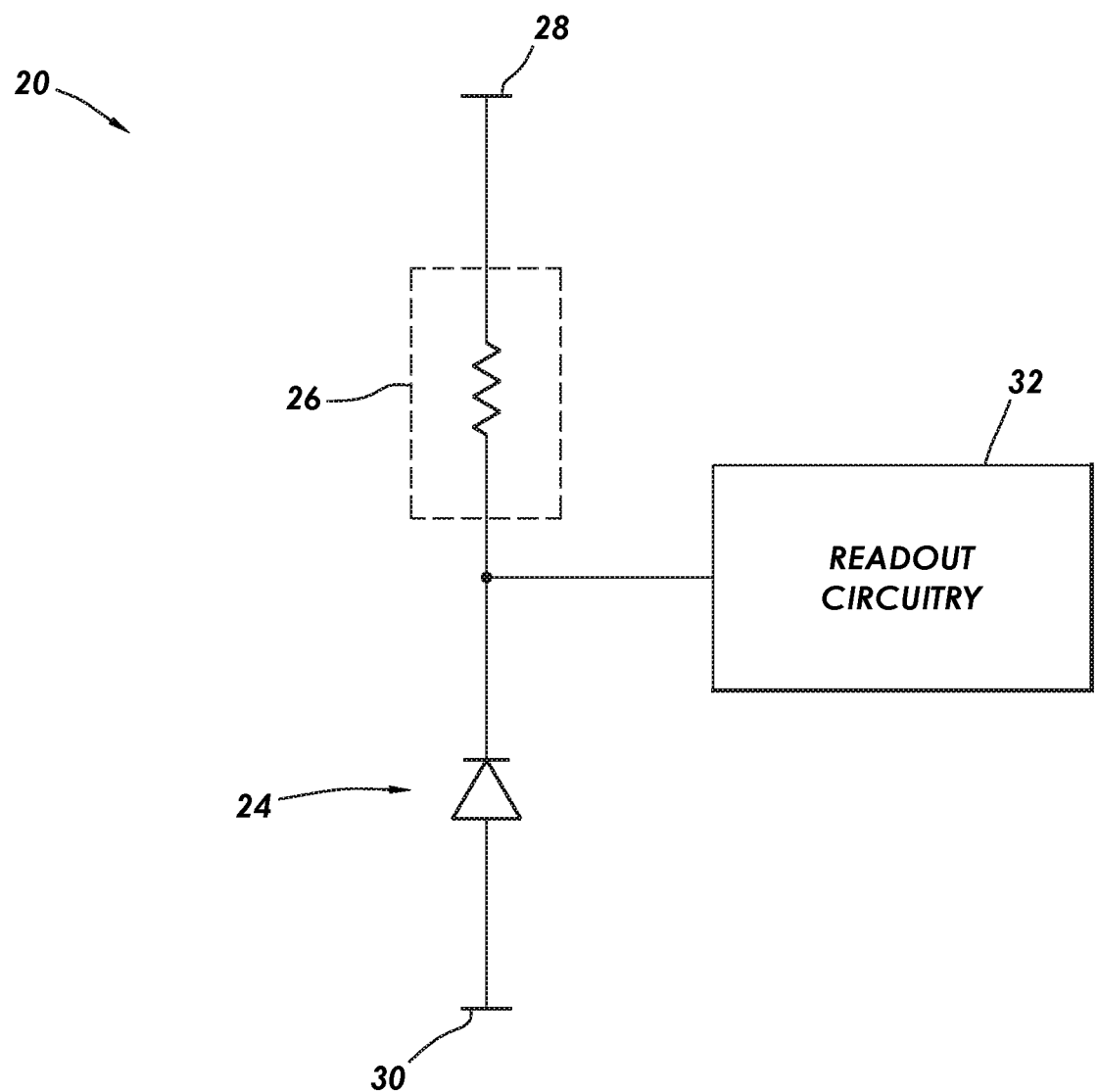
FIG. 3 is a circuit diagram of an illustrative single-photon avalanche diode pixel in accordance with some embodiments.

FIG. 3 is a circuit diagram of an illustrative SPAD device 20. Herein, each SPAD device may be referred to as a SPAD pixel 202. As shown in FIG. 3, SPAD device 20 includes a SPAD 24 that is coupled in series with quenching circuitry 26 between a first supply voltage terminal 28 (e.g., a ground power supply voltage terminal) and a second supply voltage terminal 30 (e.g., a positive power supply voltage terminal). During operation of SPAD device 20, supply voltage terminals 28 and 30 may be used to bias SPAD 24 to a voltage that is higher than the breakdown voltage of SPAD 24. Breakdown voltage is ideally the largest (reverse) bias voltage that can be applied without causing an exponential increase in the leakage current in the diode. When SPAD 24 is biased above the breakdown voltage in this manner, absorption of a single-photon can trigger a short-duration but relatively large avalanche current through impact ionization.

Quenching circuitry 26 (sometimes referred to as quenching element 26) may be used to lower the bias voltage of SPAD 24 to or below the level of the breakdown voltage. Lowering the bias voltage of SPAD 24 below the breakdown voltage stops the avalanche process and corresponding avalanche current. There are numerous ways to form quenching circuitry 26. Quenching circuitry 26 may be passive quenching circuitry or active quenching circuitry. Passive quenching circuitry may, without external control or monitoring, automatically quench the avalanche current once initiated. For example, FIG. 1 shows an example where a resistor is used to form quenching circuitry 26. This is an example of passive quenching circuitry. After the avalanche is initiated, the resulting current rapidly discharges the capacity of the device, lowering the voltage at the SPAD to near or below the breakdown voltage. The resistance associated with the resistor in quenching circuitry 26 may result in the final current being lower than required to sustain itself. SPAD 24 may then be reset to above the breakdown voltage to enable detection of another photon.

This example of passive quenching circuitry is merely illustrative. Active quenching circuitry may also be used in SPAD device 20. Active reset circuitry may reduce the time it takes for SPAD device 20 to recover. This may allow SPAD device 20 to detect incident light at a faster rate than when passive reset circuitry is used, improving the dynamic range of the SPAD device. Active reset circuitry may modulate the SPAD quench resistance. For example, before a photon is detected, quench resistance is set high, and then once a photon is detected and the avalanche is quenched, quench resistance is minimized to reduce recovery time.

SPAD device 20 may also include readout circuitry 32. There are numerous ways to form readout circuitry 32 to obtain information from SPAD device 20. Readout circuitry 32 may include a pulse counting circuit that counts arriving photons. Alternatively, or additionally, readout circuitry 32 may include time-of-flight circuitry that is used to measure photon time-of-flight (ToF). The photon time-of-flight information may be used to perform depth sensing. If desired, readout circuitry 32 may include any suitable functional circuitry. As an example, readout circuitry 32 may also include amplification circuitry and/or driver circuitry, if desired.

In some embodiments, multiple SPAD devices (e.g., multiple SPADs 24) may be grouped together as a silicon photomultiplier to increase dynamic range. Readout circuitry for the silicon photomultiplier may measure the combined output current from all of SPAD pixels in the silicon photomultiplier. The silicon photomultiplier may have a common output or per-pixel readout capabilities. As another example, an array of silicon photomultipliers (each including more than one SPAD pixel) may be included in the imaging system. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns. While there are a number of possible use cases for SPAD pixels as discussed above, the underlying technology used to detect incident light is the same. All of the aforementioned examples of devices that use SPAD elements, and in general any devices having SPADs or elements that function in the manner described herein, may collectively be referred to as SPAD-based semiconductor devices.

Still referring to FIG. 3, SPAD pixel 20 in FIG. 3 may suffer from detector paralysis phenomenon, whereby the pixel output pulse width is extended if the time-gap between adjacent photon arrivals is on average less than the time it takes SPAD 24 to fully recover its excess voltage from a previous detection event. While active reset and quench circuitry, if implemented, allows for a shorter recovery time, such a SPAD device suffers from vulnerability during the recovery time (e.g., a photon received during when the quench resistance is lowered by reset circuitry will possibly disable the SPAD permanently).

Figure 4:
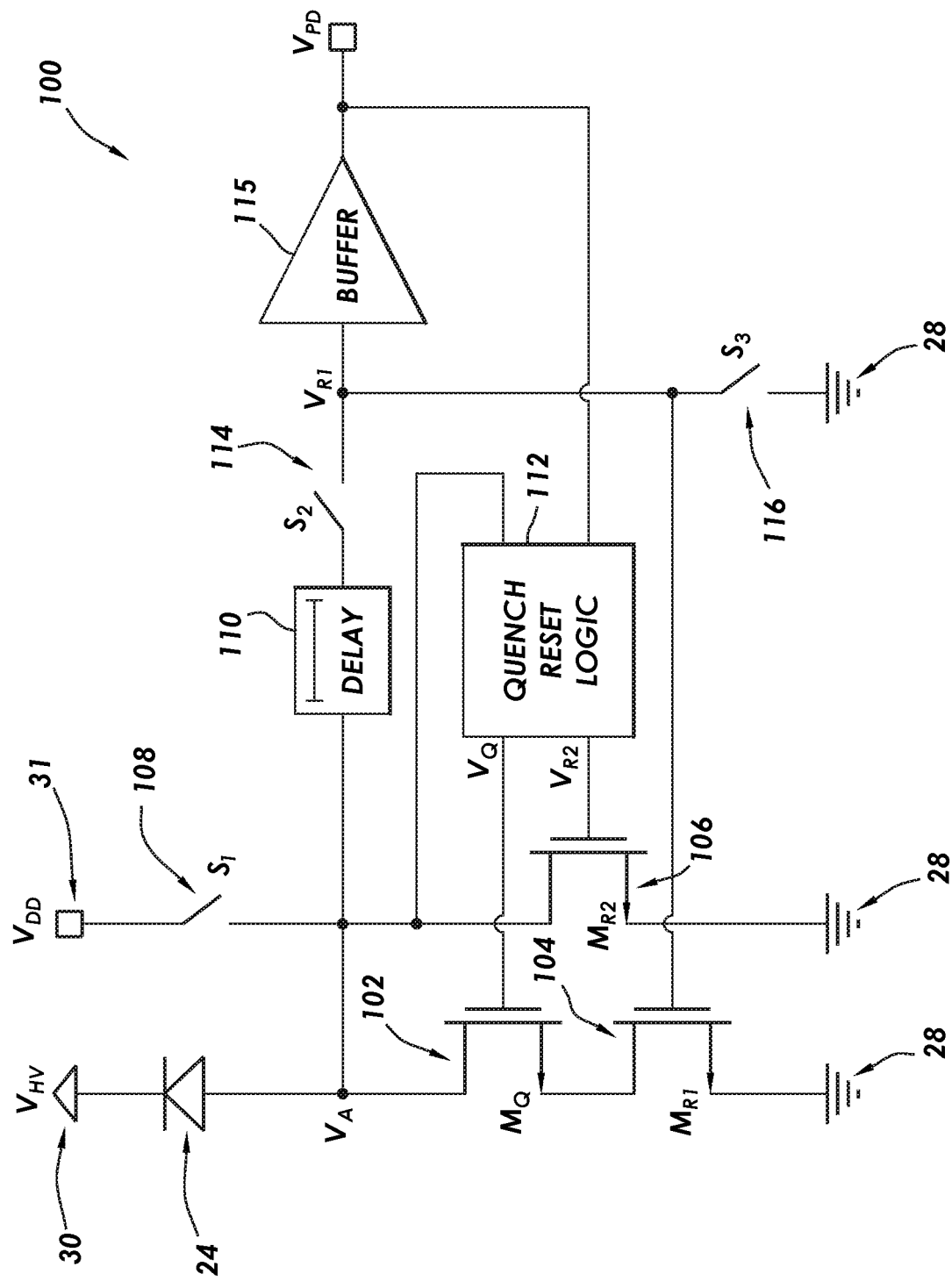
FIG. 4 is a diagram of an illustrative single-photon avalanche diode pixel with a mixed quench and reset scheme in accordance with some embodiments.

To mitigate these issues, SPAD pixel 100 is introduced in FIG. 4. As shown in FIG. 4, SPAD pixel 100 may include transistors 102 and 104 coupled in series between SPAD 24 and supply voltage terminal 28 along a first path. Additionally, transistor 106 may be coupled between SPAD 24 and supply voltage terminal 28 along a second path that is parallel to the first path. The combination of transistors 102, 104, and 106 may implement quench and reset circuitry for SPAD 24 to engage in SPAD recovery after receiving an incident photon. Transistors 102 and 106 may receive control signals $V_Q$ and $V_{R2}$ at respective gate terminals from quench reset logic (circuitry) 112. While terminals 28 coupled to transistors 104 and 106 are shown separately, because terminals 28 provide the same voltage (e.g., a grounding voltage), the separate terminals may be referred to herein as the same terminal. In other words, transistors 104 and 106 being coupled to the same terminal 28 may refer to cases where transistors 104 and 106 are coupled to separate locations on one or more conductive structures (e.g., a voltage supply rail) that supplies the same voltage. This interpretation may be similarly applied to any other analogous terminal couplings.

A readout path of SPAD pixel 100 may couple node $V_A$ to node $V_{PD}$. Delay circuit 110, switch 114, and buffer circuitry 115 may be coupled in series along the readout path. Node $V_{R2}$ may be interposed between switch 114 and buffer circuitry 115. Transistor 104 may receive the signal at node $V_{R2}$ at its gate terminal. Quench reset logic 112 may be coupled to nodes $V_A$ and $V_{PD}$ and receive signals at these nodes as inputs to generate control signals $V_Q$ and $V_{R2}$.

SPAD pixel 110 may also include supply voltage terminal 31 that supplies voltage $V_{DD}$ (which may be the same or different from the voltage supplied at terminal 30). Pull-up switch 108 may couple terminal 31 to node $V_A$ to selectively pull up node $V_A$ to voltage $V_{DD}$. Pull-down switch 116 may be coupled between the node $V_{R1}$ and supply voltage terminal 28 to selectively pull down node $V_{R1}$ to a voltage provided at terminal 28 and to provide the voltage provided at terminal 28 to the gate terminal of transistor 104.

The first path coupling node $V_A$ to terminal 28 (e.g., the path on which transistors 102 and 104 lie) may be referred to herein as a first reset path, a primary reset path, or a fast reset path, for example resulting in a short output pulse width of less than 5 ns. In particular, transistors 102 and 104 may provide the quench resistance for the first path and hence serve as a variable resistor for the first path. Transistor 104 may be selective enabled to lower the quench resistance along the first path and provide a fast recovery time. In other words, transistor 104 may provide reset capabilities to SPAD 24 (e.g., may be operable to return SPAD 24 to a bias condition that enables SPAD 24 to detect a photon when both transistors 102 and 104 are in an active state).

The second path coupling node $V_A$ to terminal 28 (e.g., the path on which transistor 106 lie) may be referred to herein as a second reset path, a secondary reset path, or a slow reset path. Transistor 106 may provide the quench resistance for the second path and hence serves as a variable resistor for the second path. The first path may be used to desirably provide fast recovery to SPAD 24 by enabling transistors 102 and 104 simultaneously, thereby providing lowered quench resistance along the first path and fast reset operations. However, by doing so, the first path is vulnerable to surging current (e.g., from an incident photon) because of the lower resistance. The second path therefore provides an alternative reset path for SPAD 24 when the photon reaches SPAD during the recovery process of the first path when the quench resistance is lowered. In particular, transistor 102 may be disabled and transistor 106 may be enabled to use the second path. By doing so, the quench resistance along the first path is raised, and the quench resistance along the second path is lowered, thereby switching from the first path to the second path to perform recovery (e.g., reset) operations using transistor 106. In other words, transistor 106 may now provide reset capabilities to SPAD 24 (e.g., may be operable to return SPAD 24 to a bias condition that enables SPAD 24 to detect a photon when transistor 106 is in an active state). Even in this case, transistor 102 being disabled may provide quenching for SPAD 24. Quench reset logic 112 may be used to control transistors 102 and 106 to operate in the above-mentioned manner by providing corresponding controls signals $V_Q$ and $V_{R2}$.

SPAD pixel 100 may also include switches 108, 114, and 116, which may be controlled based on the same control signal (e.g., a pixel select signal, a column select signal, etc.). As an example, during operation of SPAD pixel 100 (e.g., when SPAD pixel 100 is active and enabled to detect photons and read out electrical signals based on the detected photons), switches S1 and S3 may be open or disabled, while switch S2 may be closed and enabled. Switches S1 and S3 may be closed and enabled, while switch S2 may be open and disabled, when SPAD pixel 100 is disabled. By providing these switches, SPAD pixel 100 may be actively disabled by holding nodes at set voltages and disabling feedback paths that may otherwise adversely affect operations of adjacent pixels or undesirably consume excess power.

Figure 5:
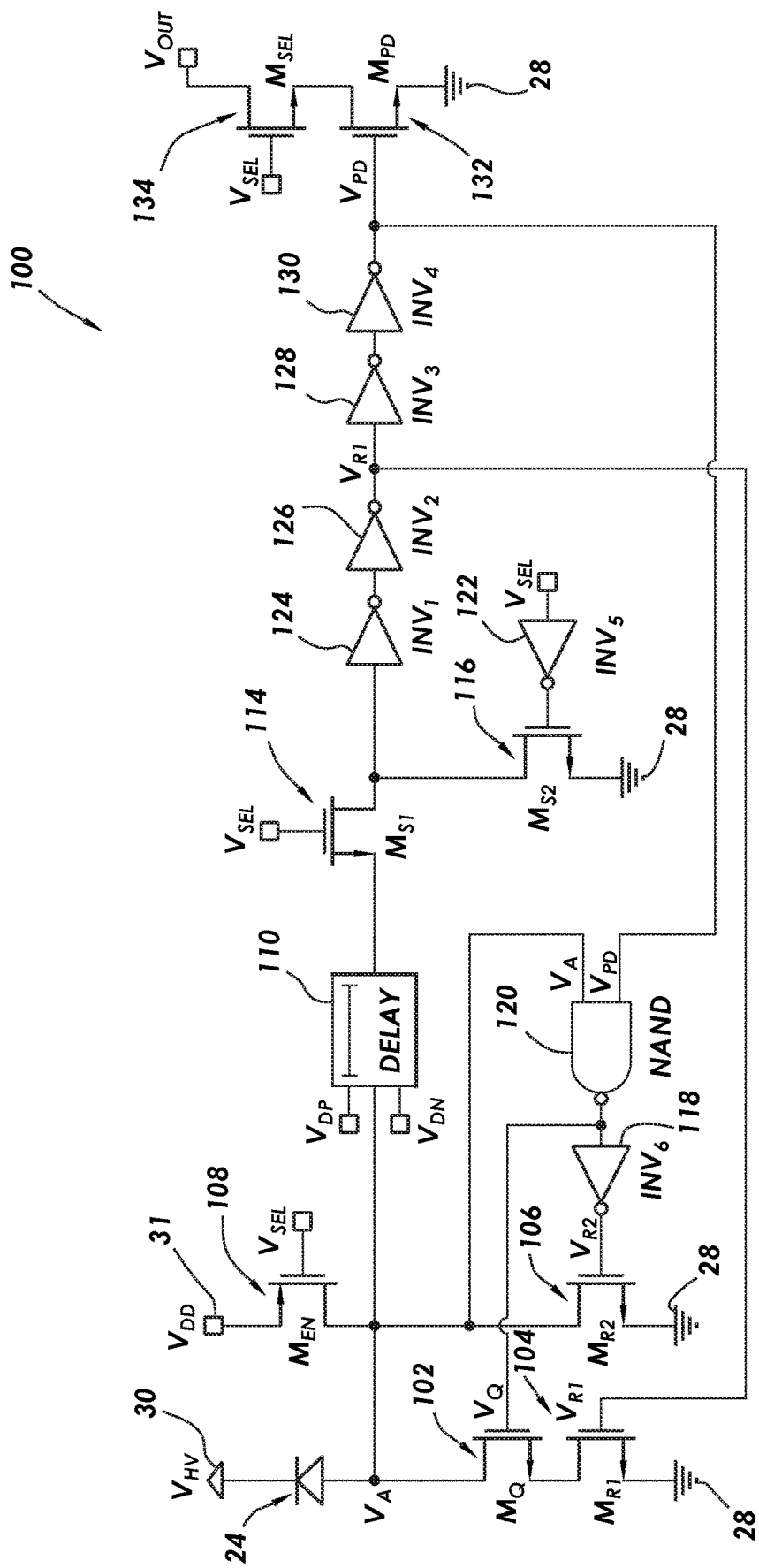
FIG. 5 is a circuit diagram of an illustrative single-photon avalanche diode pixel with illustrative circuitry for implementing a mixed quench and reset scheme in accordance with some embodiments.

FIG. 5 shows an illustrative circuit implementation of SPAD pixel 100. As shown in FIG. 5, pixel 100 in FIG. 5 may have some components that are similar to those in pixel 100 in FIG. 4 (e.g., the first and second reset paths, transistors 102, 104, and 106, SPAD 24, terminals 28, 30, and 31, etc.). The descriptions of these components are omitted to prevent unnecessarily obscuring the present embodiments. Elements in FIG. 5 with references similar to those in elements in FIG. 3 can be assumed to serve similar functions, to operate in similar manners, etc., unless otherwise described.

Referring to FIG. 5, quench reset logic 112 may be implemented using NAND logic gate 120 and inverter 118. NAND logic gate 120 may have a first input coupled to node $V_A$ and a second input that is coupled to node $V_{PD}$. The output of NAND gate 120 may be coupled to the gate terminal of transistor 102 and the input of inverter 118. The output of inverter 118 may be coupled to the gate terminal of transistor 106.

Switches 108, 114, and 116 (sometimes referred to herein as switching circuitry) may be implemented as transistors. As examples, switch 108 may be implemented as a PMOS transistor 108 that receives control signal $V_{SEL}$ at its gate terminal, switch 114 may be implemented as an NMOS transistor 114 that receives control signal $V_{SEL}$ at its gate terminal, and switch 116 may be implemented as an NMOS transistor 116 that receives an inverted version of control signal $V_{SEL}$ (via inverter 122) at its gate terminal. This implementation of switching circuitry is merely illustrative. If desired, any suitable sets of transistors or switches may be used to implement the switching circuitry.

Buffer circuitry 115 in FIG. 4 may be implemented as a series of inverters (e.g., inverters 124, 126, 128, and 130 coupled in series). The input of inverter 124 may be coupled to a source-drain terminal of transistor 114. The output of inverter 126 may be node $V_{R1}$ that is coupled to the gate terminal of transistor 104. The output of inverter 130 may be node $V_{PD}$ that is coupled to the second input of NAND logic gate 120. The is merely illustrative. If desired, inverters 124 and 126 may be implemented as part of delay circuitry 110 instead of buffer circuitry 115. As an example, inverters 124 and 126 may be omitted from FIG. 5 and instead be implemented within delay circuitry 110 in FIG. 5.

Readout circuitry for SPAD pixel 100 may include amplifier circuitry such as transistor 132 coupled between node $V_{OUT}$ and terminal 28. In particular, node $V_{PD}$ may be coupled to the gate terminal of transistor 132, whereas node $V_{OUT}$ and terminal 28 may be coupled to respective source-drain terminals of transistor 132. An additional transistor such as pixel select transistor 134 may be interposed between transistor 132 and node $V_{OUT}$ to further control the output of SPAD pixel 100. Node $V_{OUT}$ may provide the output signal for SPAD pixel 100 that is subsequently received at pixel array readout circuitry (e.g., circuitry 68 in FIG. 2).

Figure 6:
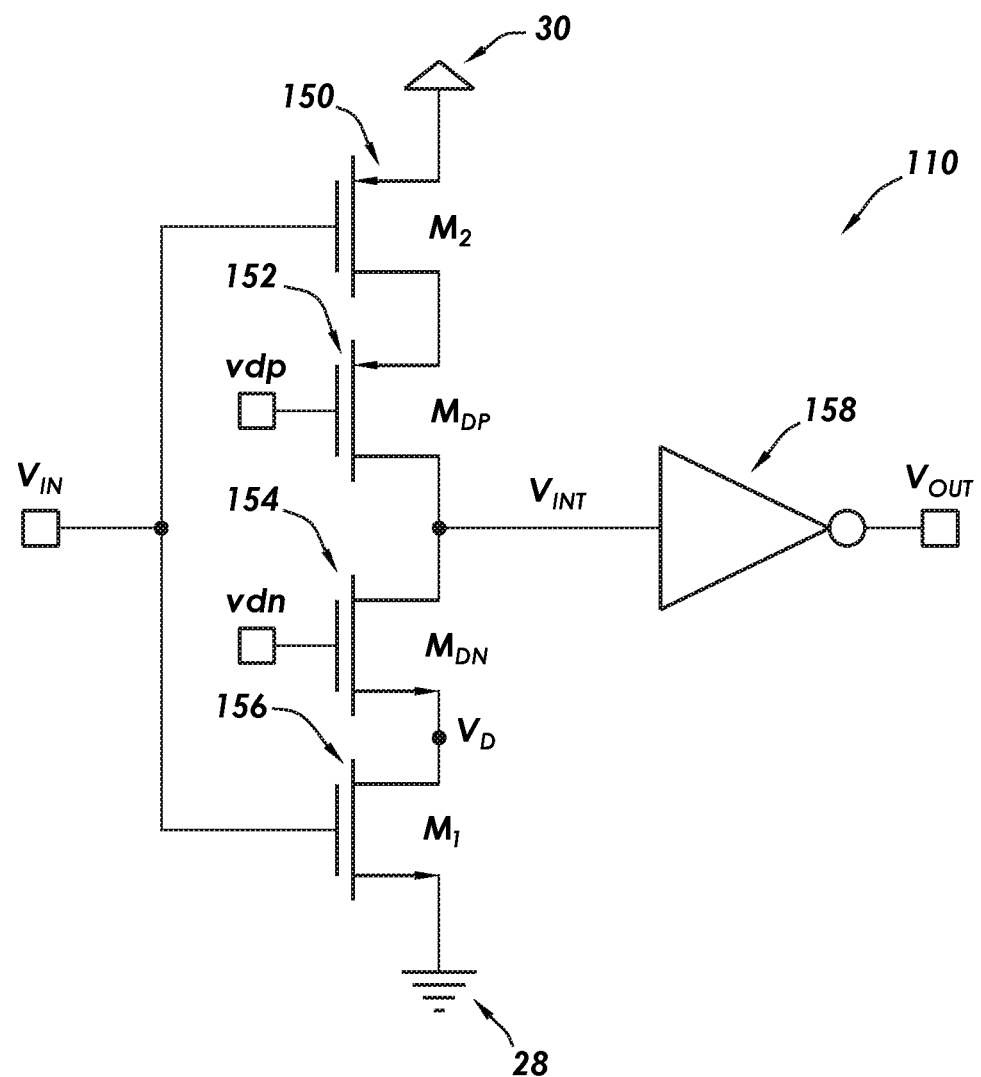
FIG. 6 is a circuit diagram of an illustrative delay element that may be used in illustrative single-photon avalanche diode pixels of the type shown in FIGS. 4 and 5 in accordance with some embodiments.

If desired, delay circuitry 110 in FIG. 4 may be implemented as voltage controlled delay element 110 as shown in FIG. 5. Voltage controlled delay element 110 in FIG. 5 may receive control voltages $V_{DP}$ and $V_{DN}$, which control the operation of delay element 110 (e.g., adjust a variable delay or hold-off period between photon detection and SPAD recharge, adjust an output pulse width, adjust the operational characteristics of delay element 110). FIG. 6 shows an illustrative configuration of delay element 110. As shown in FIG. 6, delay element 110 may include transistors 150, 152, 154, and 156, and inverter 158. Transistors 150, 152, 154, and 156 may be coupled in series between terminals 28 and 30. Gate terminals of transistors 150 and 156 may be coupled to input node $V_{IN}$ of delay element 110. Gate terminal of transistor 152 may receive control input voltage $V_{DP}$. Gate terminal of transistor 154 may receive control input voltage $V_{DN}$. The source-drain terminals of transistors 152 and 154 that are coupled to each other may also be coupled to the input of inverter 158. The output of inverter 158 may be coupled to the output node $V_{OUT}$ of delay element 110.

Configured in this manner, delay element 110 may be operable using a number of bias settings (e.g., operable in a number of modes by providing different bias voltages at gate terminals of transistors 152 and 154). As an example, in a first bias setting, voltage $V_{DN}$ may be at a first high voltage level (e.g., 3.3 V) and voltage $V_{DP}$ may be at a low voltage level (e.g., 0 V). Using the first bias setting, delay element 110 may exhibit a short hold-off period and a short output pulse. As another example, in a second bias setting, voltage $V_{DN}$ may be at a first intermediate voltage level (e.g., 1 V) and voltage $V_{DP}$ may be at a low voltage level (e.g., 0 V). Using the second bias setting, delay element 110 may exhibit a longer hold-off period and a short output pulse. As yet another example, in a third bias setting, voltage $V_{DN}$ may be at the high voltage level (e.g., 3.3 V) and voltage $V_{DP}$ may be at a second intermediate voltage level (e.g., 1.65 V). Using the third bias setting, delay element 110 may exhibit a short hold-off period and a longer output pulse. As yet another example, in a fourth bias setting, voltage $V_{DN}$ may be at the first intermediate voltage level (e.g., 1 V) and voltage $V_{DP}$ may be at the second intermediate voltage level (e.g., 1.65 V). Using the fourth bias setting, delay element 110 may exhibit a longer hold-off period and a longer output pulse.

These biasing settings and any other suitable settings may be used to desirably operate delay element 110 according to the operating requirements of SPAD pixel 100. In particular, the hold-off period relates the period of time during which the SPAD anode (e.g., node $V_A$ in FIGS. 4 and 5) is held high after a photon detection event before the SPAD is recharged. This may help in reducing the after-pulsing rate. Additionally, the output pulse width correlates to the drive capability of the pull-down network in the SPAD pixel.

The use of the delay element 110 in FIG. 6 is merely illustrative. If desired, other voltage controlled delay elements (e.g., varactors) may be used. The use of voltage controlled delay elements is similarly illustrative. If desired, any suitable delay element such as other active delay elements or passive delay elements may be used. If desired, one or more additional delay elements (e.g., inverters 124 and 126 from buffer circuitry 115 in FIG. 5) may be implemented in delay element 110.

Additionally, the configuration and implementation of pixel 100 in FIGS. 4 and 5 are merely illustrative. If desired, any suitable modifications or configurations may be provided for pixel 100 in FIGS. 4 and 5 without departing from the principles as described above (e.g., two reset paths, multiple switching transistors to disable enable pixel 100, logic circuitry that manages quench and reset paths for SPAD 24, etc.). As an example, SPAD pixel 100 in FIG. 4 may be provided without one or more of switches 108, 114, or 116. As another example, SPAD pixel 100 in FIG. 4 may be provided without one or more transistors 102, 104, and 106, but instead includes other variable resistance paths controlled by control logic. As yet another example, quench reset logic 112 may be implemented without one or more of inverter 118 and NAND gate 120, but instead includes other logic gates or circuits coupled to other nodes within SPAD pixel 100. If desired, buffer circuitry 115 may be implemented using more than four inverters or less than four inverters, or may be implemented using circuitry other than inverters.

If desired, SPAD pixel 100 in FIGS. 4 and 5 may be organized in a similar manner as described for pixel 20 in FIG. 3. As an example, multiple SPAD pixels 100 may be organized as a pixel array having columns and rows. As another example, the SPAD pixel array having pixels 100 may be coupled row control circuitry, column control and readout circuitry, control and processing circuitry in the manner described in connection with FIG. 2 for pixel 20 to form a SPAD-based semiconductor device. As yet another example, the SPAD-based semiconductor device having pixels 100 may be implemented in an imaging system in the manner described in connection with FIG. 1 for SPAD-based semiconductor device 14.

Figure 7:
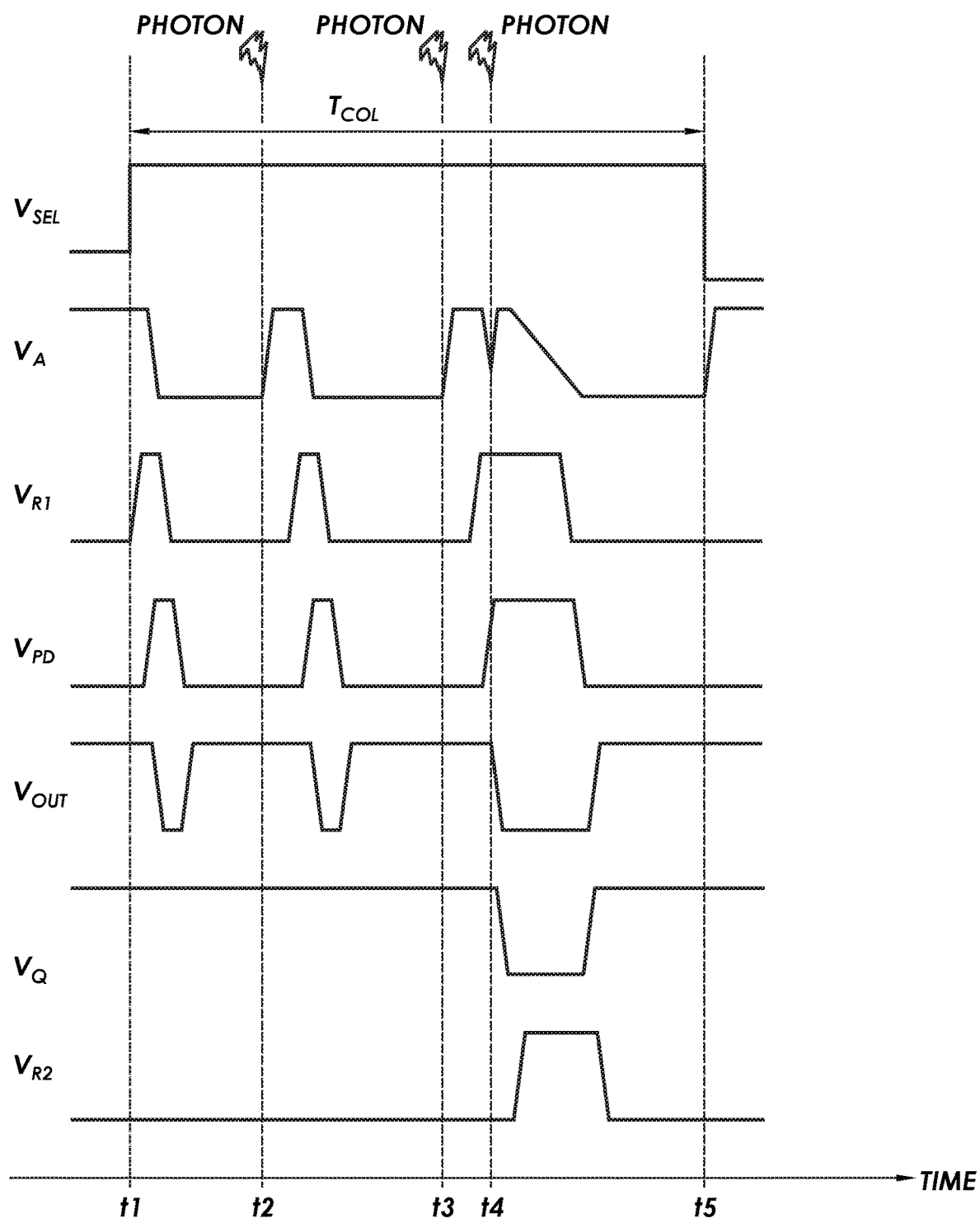
FIG. 7 is an illustrative timing diagram for operating illustrative single-photon avalanche diode pixels of the type shown in FIGS. 4 and 5 in accordance with some embodiments.

FIG. 7 shows an illustrative timing diagram for operating SPAD pixels of the type shown in FIGS. 4 and 5 (e.g., SPAD pixel 100 in FIG. 4). Prior to time t1, SPAD pixel 100 may be deactivated. Control signal $V_{SEL}$ may be deasserted to enable (i.e., close) switches 108 and 116, and disable (i.e., open) switch 114 (and disable transistor 134 in FIG. 5). SPAD node $V_A$ may be pulled high (via switch 108) thereby turning SPAD 24 off. Additionally, control signals for transistors 104 and 106 may be deasserted, and quench resistances through first and second resets paths may be both very large.

At time t1, control signal $V_{SEL}$ may be asserted (e.g., to enable SPAD pixel 100, to enable all of the pixels in a pixel column that includes SPAD pixel 100, to enable all of the pixels in a pixel row that includes SPAD pixel 100, etc.). The asserted control signal $V_{SEL}$ may enable switch 114 and may disable switches 116 and 108 (and enable transistor 134 in FIG. 5). Node $V_{R1}$ may be first pulled high (e.g., through coupling to high voltage at node $V_A$ via switch 114). The high of node $V_{R1}$ may propagate to node $V_{PD}$, and may subsequently translate to a pulling down of node $V_{OUT}$. Node $V_{R1}$ being pulled high may also turn on transistor 104. This in turn may pull SPAD node $V_A$ low to enable SPAD 24 for photon detection. SPAD node $V_A$ when held low may then pull nodes $V_{R1}$ and $V_{PD}$ low, and node $V_{OUT}$ may consequently be pulled high (e.g., using an external row driver).

Gate control signals for transistors 102 and 106 may be respectively asserted and deasserted prior to time t1 and will remain so as along as it is desirable to enable the first reset path and disable the second reset path.

At time t2, a photon may incident SPAD 24, causing SPAD node $V_A$ to be pulled high. After a suitable delay period through delay circuitry 110 and through inverters in buffer circuitry 115, nodes $V_{R1}$ and $V_{PD}$ may also be pulled high. The asserted signal at node $V_{PD}$ may turn on transistor 132 and pull node $V_{OUT}$ down.

Similar to the period between time t1 and t2, node $V_{R1}$ pulled high may turn on transistor 104. This in turn may pull SPAD node $V_A$ low to again enable SPAD 24 for subsequent photon detection. SPAD node $V_A$ when held low may then pull nodes $V_{R1}$ and $V_{PD}$ low, and the node $V_{OUT}$ may consequently be pulled high again (e.g., using the external row driver).

Since no additional photon incidents SPAD 24 during the time period in which node $V_{R1}$ is asserted (e.g., pulled high) between time t2 and t3, transistors 102 and 106 may be respectively asserted and deasserted to use the first reset path (and not the second reset path) for resetting SPAD 24. In other words, since the voltage at node $V_A$ is pulled low before the voltage at node $V_{PD}$ is pulled high, transistor 102 remains turned on (e.g. using NAND logic gate 120 in FIG. 5), and transistor 106 remains turned off (e.g., using NAND logic gate 120 and inverter 118 in FIG. 5).

At time t3, an additional photon may incident SPAD 24. Similar to the period between time t1 and t2, SPAD node $V_A$ may be pulled high. After a suitable delay period, node $V_{R1}$ may be pulled high to turn on transistor 104 and reduce the quenching resistance of the first reset path. While transistor 104 is turned on, a third photon may incident SPAD 24 at time t4. In this scenario, before SPAD node $V_A$ is completely reset (e.g., completely pulled low), SPAD node $V_A$ is pulled high by the third incident photon. Since node $V_A$ and node $V_{PD}$ are both pulled high, quench reset logic 112 (in FIG. 4) may turn off transistor 102 to enable quenching using the first reset path and to turn on transistor 106 to enable reset using the second reset path. Following time t4, transistor 106 may pull SPAD node $V_A$ low to perform quenching and reset operations. Once node $V_A$ is pulled low, quench reset logic 112 may again turn on transistor 102 and turn off transistor 106. Nodes $V_{R1}$ and $V_{PD}$ may similarly be pulled low after a delay, and $V_{OUT}$ may be pulled back up by the external row driver circuitry.

After node $V_A$ is pulled down, transistor 102 is turned on, and transistor 106 is turned off, SPAD 24 is operable to detect a subsequent photon using the first reset path. At time t5, control signal $V_{SEL}$ may be deasserted to end the photon collection period (e.g., period $T_{COL}$). By providing the two separate reset paths, even photons such as the photon received at time t4 may be efficiently detected without adverse effects to SPAD 24. As an example, the second reset path may be a slow reset path as indicated by the shallower slope of the pull down of node $V_A$ following time t4 as compared to the slope of the pull down of node $V_A$ between times t2 and t3 or between times t3 and t4.

Figure 8:
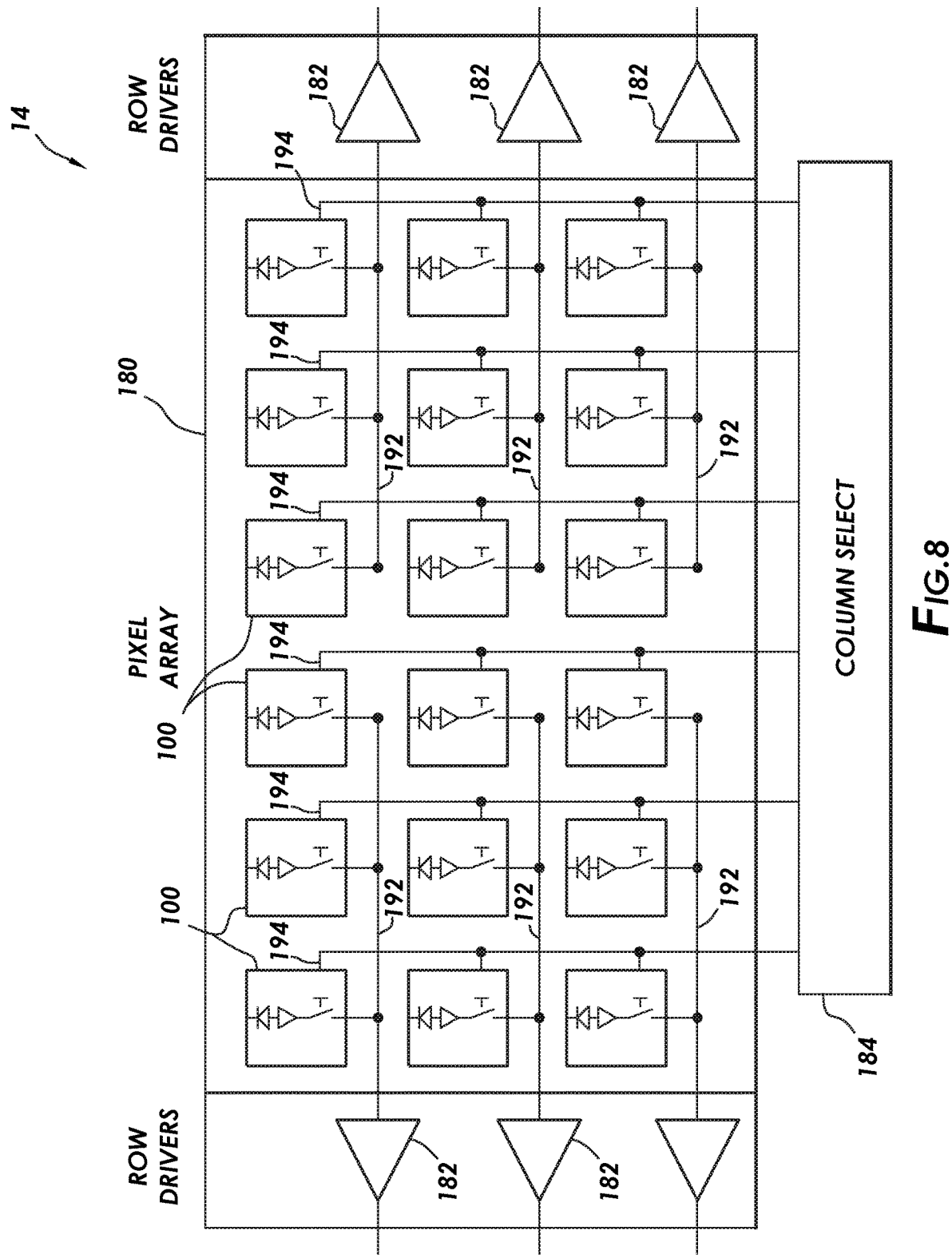
FIG. 8 is a diagram of an illustrative pixel array with single-photon avalanche diode pixels coupled to column select circuitry in accordance with some embodiments.

FIG. 8 provides an illustrative SPAD-based semiconductor device (e.g., device 14) having pixel array 180 coupled to row drivers 182 and column select circuitry 184. Device 14 may be implemented in a column scanning scheme. In particular, pixels 100 (e.g., each having a similarly configuration as pixel 100 in FIGS. 4 and 5) in array 180 may be arranged in columns and rows. Half of pixels 100 in a given row may be coupled to a shared or common driver circuit using a corresponding row line 192. Row line 192 may serve as a pull-up network for the shared driver circuit. In contrast, each pixel 100 may include its own pull-down network (e.g., circuitry coupling nodes of pixel 100 to terminal 28 in FIGS. 4 and 5). While an incident photon may cause a particular pixel to pull down a corresponding row line 192, the corresponding shared row driver may pull row line 192 back up when desired.

Additionally, each column of pixels 100 may be coupled to column select circuitry 184 via respective column lines 194. Each shared column line may provide control signal $V_{SEL}$ or other control signals to pixels 100 in that column. As such, an active column may receive an asserted control signal $V_{SEL}$, while the remaining columns may receive a deasserted control signal $V_{SEL}$.

The configuration of device 14 in FIG. 8 is merely illustrative. If desired, each row of pixels 100 may be divided in any suitable manner (e.g., not only split in half) to share a row line coupled to a corresponding common row driver. If desired, row drivers 182 and column select circuitry may be implement as a part of row control circuitry and/or column control and readout circuitry (e.g., as part of row circuitry 66 and column circuitry 68 in FIG. 2). If desired, row drivers 182 may be provided only on one side of pixel array 180 instead of both.

Various embodiments have been described illustrating systems with improved SPAD devices and methods for operating these improved SPAD devices.

Embodiments according to various aspects may use a mixed passive/active reset/quench scheme. According to an exemplary embodiment, a SPAD cell may comprise a primary (fast) reset path configured to provide a fast reset path for primary photons resulting in short output pulse widths, for example of less than 5 ns. The SPAD cell may comprise a secondary (slow) reset path configured to ensure that avalanche is quenched even if photons arrive during the reset time from a previous detection event, for example when the quenching impedance is still at a low value. Active quenching may operate to quench avalanche current if a secondary photon arrives during primary reset. Active quenching may completely quench such avalanche current in some embodiments. In some exemplary embodiments, pixel column scanning mode may be supported by the application of integrated switches that break the active reset feedback path when the pixel column is disabled. According to various embodiments (referring to FIG. 4) switch S1 may be used to pull-up the anode voltage (disabling SPAD), while switches S2 and S3 may break the active reset feedback loop, so that no oscillation and no current flow can occur while SPAD is disabled.

Referring to FIG. 5, a SPAD cell according to various aspects of the present invention may comprise a SPAD, a SPAD enable/disable, a delay element, internal drivers, a pull-down network, a fast reset path, a slow reset path, quench reset logic, and column select control. The SPAD may comprise a p+/n-well SPAD. The SPAD enable/disable may comprise a pull-up transistor, for example an anode pull-up transistor. The delay element may comprise a voltage controlled delay element. The internal drivers may comprise one or more series-connected inverters. The column select control may comprise one or more column select switches and/or other devices configured to break internal VR1 feedback path when the column is disabled. In an exemplary embodiment, the quenching operation is achieved by current flow through a transistor that is occupying smaller area and providing higher resistance. In an exemplary embodiment, avalanche current always decays exponentially regardless when avalanche occurs during reset time because active quenching is event driven.

Referring to FIG. 8, a SPAD pixel array according to various embodiments is shown. The pixel may be designed for a column scanning array implementation. A half-row of pixels may share a common row line that is terminated by a row driver circuit. The row driver circuit may serve as the pull-up network for the common row line. Each individual pixel may contain an independent pull-down network. A photon arrival may cause the pixel to pull-down the row line, the row driver circuit pulls the row line back up after a fixed delay. A single column of pixels may be activated by the column select circuit, providing the $V_{SEL}$ signal for each column.

Referring to FIG. 7, timing for a SPAD cell according to various aspects of the present technology is shown, for example with reference to FIG. 5. An exemplary timing sequence may comprise the following:

$V_{SEL}$ is LOW, $V_A$ is pulled HIGH so SPAD is OFF, VR1 is LOW, MR1 & MR2 are OFF, SPAD quench resistance is very large $V_{SEL}$ goes HIGH to enable pixel column, MS1 turns ON & MS2 turns OFF, VR1 pulled HIGH, MPD pulls down VOUT, MR1 turns ON, VA pulled LOW (SPAD armed), MR1 turns OFF, MPD turns OFF, external row driver pulls VOUT back UP Photon arrival pulls up VA (passive quench), VR1 & VPD go HIGH, MPD pulls down VOUT VR1 rising edge turns on MR1, pulling VA back down after delay dt (lowering quench resistance for fast reset), VR1 & VPD go back DOWN, external row driver circuit pulls up VOUT If no photon arrives during reset, VA falls before VPD rises, ensuring that MQ stays ON (fast reset)

If photon arrives during reset, VA gets pulled back up while VPD is HIGH

NAND gate detects both VA and VPD HIGH, so MQ turns OFF (raising quench resistance)

MR2 turns ON (slow reset path), pulling VA & VR1 back DOWN through MR2, MQ turns back ON, MPD turns OFF, VOUT is pulled back UP by external row driver circuit Ready to detect next photon while VSEL is HIGH Referring to FIG. 6, a voltage controlled delay element may allow the pixel to operate with different hold-off times and output pulse widths. The hold-off time is the time delay between photon detection and SPAD recharge. Hold-off means the SPAD anode voltage is held HIGH for a period of time after a photon detection event to allow the population of trapped carriers in junction to decay before SPAD is recharged. This may aid in reducing the after-pulsing rate. A wider output pulse width may provide the in-pixel pull-down network better drive capability, which may be important when the common row line capacitance is very large as may be the case in large arrays. Any suitable delay element may be used.

Various embodiments may use a varactor, current starved inverter, output split inverter, or any other suitable voltage controlled delay element.

In some embodiments, an image pixel may include a single-photon avalanche diode coupled, a first reset path coupling the single-photon avalanche diode to a grounding voltage terminal, and a second reset path coupling the single-photon avalanche diode to the grounding voltage terminal. The single-photon avalanche diode may have a first terminal coupled to a positive supply voltage terminal and a second terminal that is coupled to a node. First and second transistors may be coupled between in parallel between the node and the second supply voltage terminal along the first and second reset paths, respectively.

The image pixel may include logic circuitry configured to generate a first control signal for a gate terminal of the first transistor and a second control signal for a gate terminal of the second transistor. The first control signal may be an inverted version of the second control signal. The image pixel may include a readout path coupling the single-photon avalanche diode to readout circuitry, and delay circuitry that is interposed along the readout path and that has an input that is coupled to the logic circuitry. The image pixel may include buffer circuitry that is interposed along the readout path between the delay circuitry and the readout circuitry and that has an output that is coupled to the logic circuitry. The logic circuitry may be configured to generate the first and second control signals based on signals received from the input of the delay circuitry and the output of the buffer circuitry. The image pixel may include a third transistor coupled in series with the first transistor along the first reset path. An output of the delay circuitry may be coupled to a gate terminal of the third transistor. In other words, the first transistor is controlled based on a first signal generated along the readout path, wherein the second transistor is controlled based on a second signal generated along the readout path, and wherein the third transistor is controlled based on a third signal generated along the readout path The image pixel may include switching circuitry operable to couple the input of the delay circuitry to a third supply voltage terminal and operable to couple an output of the delay circuitry to the second supply voltage terminal. The switching circuitry may include a pull-up transistor coupling the node to an additional positive supply voltage terminal and a pull-down transistor coupling the output of the delay circuitry to the grounding voltage terminal. The pull-up transistor and pull-down transistor may be enabled when the pixel is inactive.

The image pixel may be provided in a semiconductor device. The second transistor may be operable to pull down the node to a grounding voltage. The first and second transistors may be operable to pull down the node to the ground voltage.

In some embodiments, a semiconductor device may include an array of single-photon avalanche diode pixels arranged in rows and columns. A first set of single-photon avalanche diode pixels in a row of the array may be coupled to a first row driver via a first row line, and a second set of single-photon avalanche diode pixels in the row of the array may be coupled to a second row driver via a second row line. The semiconductor device may include selection circuitry coupled to each column of the array via a corresponding column line.

Each single-photon avalanche diode pixel in the array may include at least two transistors that are controlled based on a signal received via the corresponding column line. The at least two transistors may include a pull-up transistor coupling a first node in the single-photon avalanche diode pixel a first supply voltage terminal, and a pull-down transistor coupling a second node in the single-photon avalanche diode pixel to a second supply voltage terminal.

The foregoing is merely illustrative of the principles of this invention and various modifications can be made by those skilled in the art. The foregoing embodiments may be implemented individually or in any combination.

What is claimed is:

1. An image pixel, comprising:
   a single-photon avalanche diode coupled between first and second supply voltage terminals;
   a first reset path coupling the single-photon avalanche diode to the second supply voltage terminal;
   a second reset path coupling the single-photon avalanche diode to the second supply voltage terminal;
   a first transistor coupled along the first reset path;
   a second transistor coupled along the second reset path; and
   logic circuitry configured to generate a first control signal for a gate terminal of the first transistor and a second control signal for a gate terminal of the second transistor.

2. The image pixel defined in claim 1, wherein the first supply voltage terminal is configured to provide a positive supply voltage and the second supply voltage terminal is configured to provide a grounding voltage.

3. The image pixel defined in claim 2, wherein the single-photon avalanche diode has a first terminal coupled to the first supply voltage terminal and a second terminal that is coupled to a node and wherein the first and second transistors are coupled in parallel between the node and the second supply voltage terminal.

4. The image pixel defined in claim 1, wherein the first control signal is an inverted version of the second control signal.

5. The image pixel defined in claim 1, further comprising:
a readout path coupling the single-photon avalanche diode to readout circuitry; and
delay circuitry coupled along the readout path, wherein the delay circuitry has an input that is coupled to the logic circuitry.

6. The image pixel defined in claim 5, further comprising:
buffer circuitry coupled along the readout path between the delay circuitry and the readout circuitry, wherein the buffer circuitry has an output that is coupled to the logic circuitry.

7. The image pixel defined in claim 6, wherein the logic circuitry is configured to generate the first and second control signals based on signals received from the input of the delay circuitry and the output of the buffer circuitry.

8. The image pixel defined in claim 7, further comprising:
a third transistor coupled in series with the first transistor along the first reset path, wherein an output of the delay circuitry is coupled to a gate terminal of the third transistor.

9. The image pixel defined in claim 5, further comprising:
switching circuitry operable to couple the input of the delay circuitry to a third supply voltage terminal and operable to couple an output of the delay circuitry to the second supply voltage terminal.

10. A semiconductor device comprising:
a pixel that includes:
a single-photon avalanche diode having a first terminal coupled a supply voltage terminal and a second terminal coupled to a node, wherein the node is pulled to a first voltage in response to an incident photon;
a first transistor that is coupled to the node;
a second transistor that is coupled to the node and that is operable to pull the node to a second voltage;
a third transistor that is coupled in series with the first transistor, wherein the first and third transistors are operable to pull the node to the second voltage; and
a readout path, wherein the first, second, and third transistors are controlled based on a set of signals generated along the readout path.

11. The semiconductor device defined in claim 10, wherein the pixel includes:
readout circuitry coupled to the node using the readout path; and
delay circuitry interposed between the node and the readout circuitry.

12. The semiconductor device defined in claim 11, wherein the pixel includes:
a pull-up transistor coupling the node to a first additional supply voltage terminal; and
a pull-down transistor coupling an output of the delay circuitry to a second additional supply voltage terminal.

13. The semiconductor device defined in claim 12, wherein the pull-up transistor and pull-down transistor are enabled when the pixel is inactive.

14. The semiconductor device defined in claim 10, wherein the first transistor is controlled based on a first signal generated along the readout path and wherein the second and third transistors are controlled based on second and third signals generated along the readout path.

15. A semiconductor device comprising:
a single-photon avalanche diode coupled between first and second supply voltage terminals;
a first transistor coupling the single-photon avalanche diode to the second supply voltage terminal, the first transistor having a first gate terminal configured to receive a first control signal; and
a second transistor coupling the single-photon avalanche diode to the second supply voltage terminal, the second transistor having a second gate terminal configured to receive a second control signal that is an inverted version of the first control signal.

* * * * *